United States Patent
Kito

[19]

[11] Patent Number: 5,977,587
[45] Date of Patent: Nov. 2, 1999

[54] SEMICONDUCTOR DEVICE AND A METHOD FOR WIRING OF A SEMICONDUCTOR DEVICE

[75] Inventor: Takayuki Kito, Kyoto, Japan

[73] Assignee: Rohm Co., Ltd., Kyoto, Japan

[21] Appl. No.: 08/672,978

[22] Filed: Jul. 1, 1996

[30] Foreign Application Priority Data

Jun. 29, 1995 [JP] Japan .................................. 7-163321

[51] Int. Cl.$^6$ .......................... H01L 29/76; H01L 29/94; H01L 31/062; H01L 31/113
[52] U.S. Cl. .......................... 257/327; 257/341; 257/773
[58] Field of Search .................................. 257/327, 335, 257/368, 690, 692, 508, 773, 341

[56] References Cited

U.S. PATENT DOCUMENTS

| | | | |
|---|---|---|---|
| 4,045,811 | 8/1977 | Dingwall | 257/335 |
| 5,089,874 | 2/1992 | Deguchi et al. | 357/40 |
| 5,174,858 | 12/1992 | Yamamoto et al. | |
| 5,309,023 | 5/1994 | Motonami et al. | 257/751 |
| 5,432,381 | 7/1995 | Melzner | 257/774 |
| 5,504,029 | 4/1996 | Murata et al. | |
| 5,519,241 | 5/1996 | Oppermann et al. | 257/327 |
| 5,614,762 | 3/1997 | Kanamori et al. | 257/471 |
| 5,631,484 | 5/1997 | Tsoi et al. | 257/327 |
| 5,672,894 | 9/1997 | Maeda et al. | 257/335 |
| 5,719,429 | 2/1998 | Yoshida et al. | 257/401 |
| 5,744,854 | 4/1998 | Okada et al. | 257/587 |

*Primary Examiner*—Olik Chaudhuri
*Assistant Examiner*—Phat X. Cao
*Attorney, Agent, or Firm*—Darby & Darby

[57] ABSTRACT

A perimeter gate wiring 52 comprises a contact portion 54 and an interconnecting portion 56 having narrower width than the contact portion 54 which connects the contact portion 54 mutually. And the perimeter gate wiring 52 is connected electrically with the gate perimeter portion 66 at the contact portion 54. A source wiring perimeter portion 58 comprises a contact portion 60 and an interconnecting portion 62 having narrower width than the contact portion 60 which connects the contact portion 60 mutually. And the source wiring perimeter portion 58 is connected electrically with a perimeter diffusion layer 74 in the contact portion 60. The contact portion 54 of the perimeter gate wiring 52 and the interconnecting portion 62 of the source wiring perimeter portion 58 are provided adjacently. Also, the interconnecting portion 56 of the perimeter gate wiring 52 and the contact portion 60 of the source wiring perimeter portion 58 are provided with one another adjacently. So that, it is possible to narrow a width of both the perimeter gate wiring 52 and the source wiring perimeter portion 58 with maintaining contact between the gate perimeter portion 66 and the like.

12 Claims, 14 Drawing Sheets

SEMICONDUCTOR DEVICE AND A METHOD FOR WIRING OF A SEMICONDUCTOR DEVICE

BACKGROUND OF INVENTION

1. Field of the Invention

This invention relates to a semiconductor device, more specifically a semiconductor device being capable of compact its wiring.

2. Description of the Related Art

A vertical type double diffusion metal oxide field effect transistor (D-MOSFET), a kind of power MOSFET is known very well as a semiconductor device for power source to a person skilled in the art. FIG. 12 is a plane view of the D-MOSFET in the prior art. As shown in FIG. 13 illustrating plane P1—P1, the D-MOSFET 2 comprises a drain region D consist of a substrate 4 and an epitaxial growth layer 6, a plurality of channel formation region 8 formed in the epitaxial growth layer 6 and source regions S formed within each of channel formation regions 8 in dough nut shape.

A source wiring 10 made of aluminum is positioned so as to cover center part of the D-MOSFET 2 (see FIG. 12). The source wiring 10 is connected with each of the source regions S through each source contact 12. A source pad 24 is provided with a part of the source wiring 10 (see FIG. 12).

A part of the each channel formation regions 8 functions as channel regions 14. A plurality of gate G made of polysilicon is positioned on each of the channel regions 14 through a gate oxidation layer 16. All the gate G formed on the each of the channel regions 14 are connected each other. A part of the gate G is connected to a gate pad 22 through a gate electrode 18 made of aluminum and a protective resistor 20. Besides, a drain electrode 26 is provided under the substrate 4.

Thus, a high output currency can be obtained between the source pad 24 (see FIG. 12) and the drain electrode 26 by connecting a plurality of the MOSFET in parallel using the gate pad 22 as a control input terminal.

However, since the gate G are connected to the gate electrode 18 in part. So that, voltage drop in accordance with electric resistance of polysilicon is caused around a part located far from the gate electrode 18 (for instance, vicinity of a part P2 in FIG. 12) when a voltage is applied to the gate pad 22. The part located far from the gate electrode 18 can not be operated properly when large amount of voltage drop occurred.

As shown in FIG. 14A and FIG. 14B both of which enlarge vicinity of the part P2, in order to prevent occurrence of voltage drop at the perimeter of the D-MOSFET 2, a perimeter gate wiring 28 made of aluminum having lower electric resistance is composed as follows. The perimeter gate wiring 28 is positioned to vicinity of perimeter of the D-MOSFET 2 thorough a perimeter gate contact 30 so as to contact to a gate perimeter portion 32.

In the same manner, in order to maintain a voltage among the source regions S studded over a wide range, the perimeter diffusion layer 34 is formed in the epitaxial growth layer 6 positioned vicinity of perimeter of the D-MOSFET 2. And the perimeter source wiring 38 made of aluminum is positioned on the perimeter diffusion layer 34 through an insulation layer 40 so as to contact the perimeter source wiring 38 with the perimeter diffusion layer 34 through a perimeter source contact 36.

Thus, it is possible to maintain the gate voltage substantially uniform to all over the chip of D-MOSFET 2 by applying the voltage direct to the gate perimeter portion 32 located far from the gate electrode 18 with the perimeter gate wiring 28 made of aluminum. Also, source voltage can be maintained substantially uniform to all over chip of the D-MOSFET by applying the voltage directly to the perimeter diffusion layer 34 with the perimeter source wiring 38 made of aluminum.

However, the D-MOSFET described in the above has following problem to resolve. It is necessary to provide the perimeter source wiring 38 connected with the perimeter diffusion layer 34 through the perimeter source contact 36 in vicinity of perimeter of the chip. Further to that, the perimeter gate wiring 28 connected with the gate perimeter portion 32 through the perimeter gate contact 30 must be provided in parallel to the perimeter source wiring 38.

In that case, it is necessary to design a width of the perimeter source wiring 38 as a width of tolerance for mis-alignment of the perimeter source contact 36 in addition to a width of the perimeter source contact 36. Also, it is necessary to use same design rule to a width of the perimeter gate wiring 28. Further, it is necessary to design a space having certain width between the perimeter source wiring 38 and the perimeter gate wiring 28 for providing an insulation region 42. So that, a space for these wirings need to be secured in vicinity of perimeter of the chip. Therefore, size of the chip becomes large.

OBJECT AND SUMMARY OF THE INVENTION

An object of the present invention is to provide a semiconductor device having smaller space for wiring and a method for wiring of a semiconductor device both of which resolve the problem of the semiconductor device such as D-MOSFET in the prior art.

In accordance with characteristics of the present invention, regions to be connected each of which being made of semiconducting substance or conductive substance, being provided independently, a first insulation layer formed on the regions to be connected, a semiconductor device comprises:

wirings provided independently on the first insulation layer correspond to each of the regions to be connected, and being connected with each of the regions to be connected through contact holes provided in the first insulation layer, characterized in that, each of the wirings is formed so as to have contact portions provided on the contact holes and interconnecting portions having narrower width than the contact portions which connect the contact portions mutually, and the contact portions of one of the wirings are provided so as to position adjacently to the interconnecting portions of the wirings provided adjacently to one of the wirings.

Also, in accordance with characteristics of the present invention, a semiconductor device comprises:

regions to be connected each of which being made of semiconducting substance or conductive substance, being provided independently, wiring group comprises a plurality of wirings provided independently in correspond to each of the regions to be connected and each of the wirings being connected with each of the regions to be connected electrically, and insulation regions for insulating each of the wirings, characterized in that, the regions to be connected and the wiring group are formed so as to narrow maximum width of the wiring group than a total width of contact portion of each of the wirings and each of the insulation regions.

Further, in accordance with characteristics of the present invention, a method for wiring of a semiconductor having regions to be connected each of which being made of semiconducting substance or conductive substance, being provided independently, and wirings each of which being connected electrically to each of the regions to be connected, characterized in that, each of the wirings comprises contact portions and interconnecting portions having narrower width than that of the contact portions, the interconnecting portions connects the contact portions mutually, and each of the wirings is formed so as to connect to the regions to be connected electrically at the contact portions, and the contact portions of one of the wirings are provided so as to position adjacently to the interconnecting portions of the wirings provided adjacently to one of the wirings.

Still further, in accordance with characteristics of the present invention, a method for wiring of a semiconductor device comprises:

regions to be connected each of which being made of semiconducting substance or conductive substance, being provided independently, wiring group comprises a plurality of wirings provided independently in correspond to each of the regions to be connected and each of the wirings being connected with each of the regions to be connected electrically, and insulation regions for insulating each of the wirings, characterized in that, the regions to be connected and the wiring group are formed so as to narrow maximum width of the wiring group than a total width of contact portion of each of the wirings and each of the insulation regions.

While the novel features of the invention are set forth in a general fashion, both as to organization and content, it will be better understood and appreciated, along with other objections and features thereof, from the following detailed description taken in conjunction with the drawings.

DETAILED DESCRIPTION OF THE PREFERRED EMBODIMENT

Figure 1:
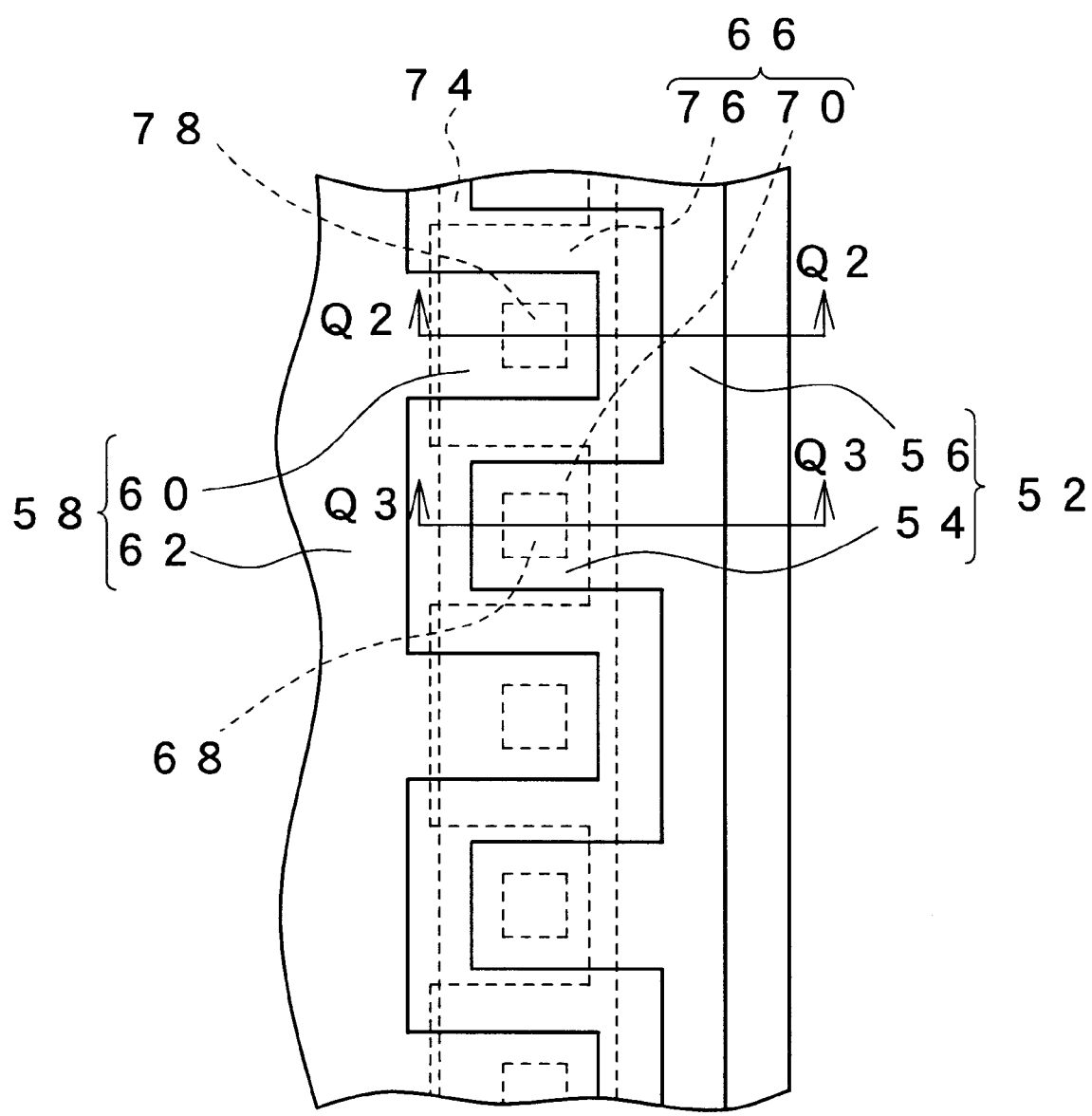
FIG. 1 is an enlarged plane view of perimeter of D-MOSFET in an embodiment of the present invention.
Figure 2:
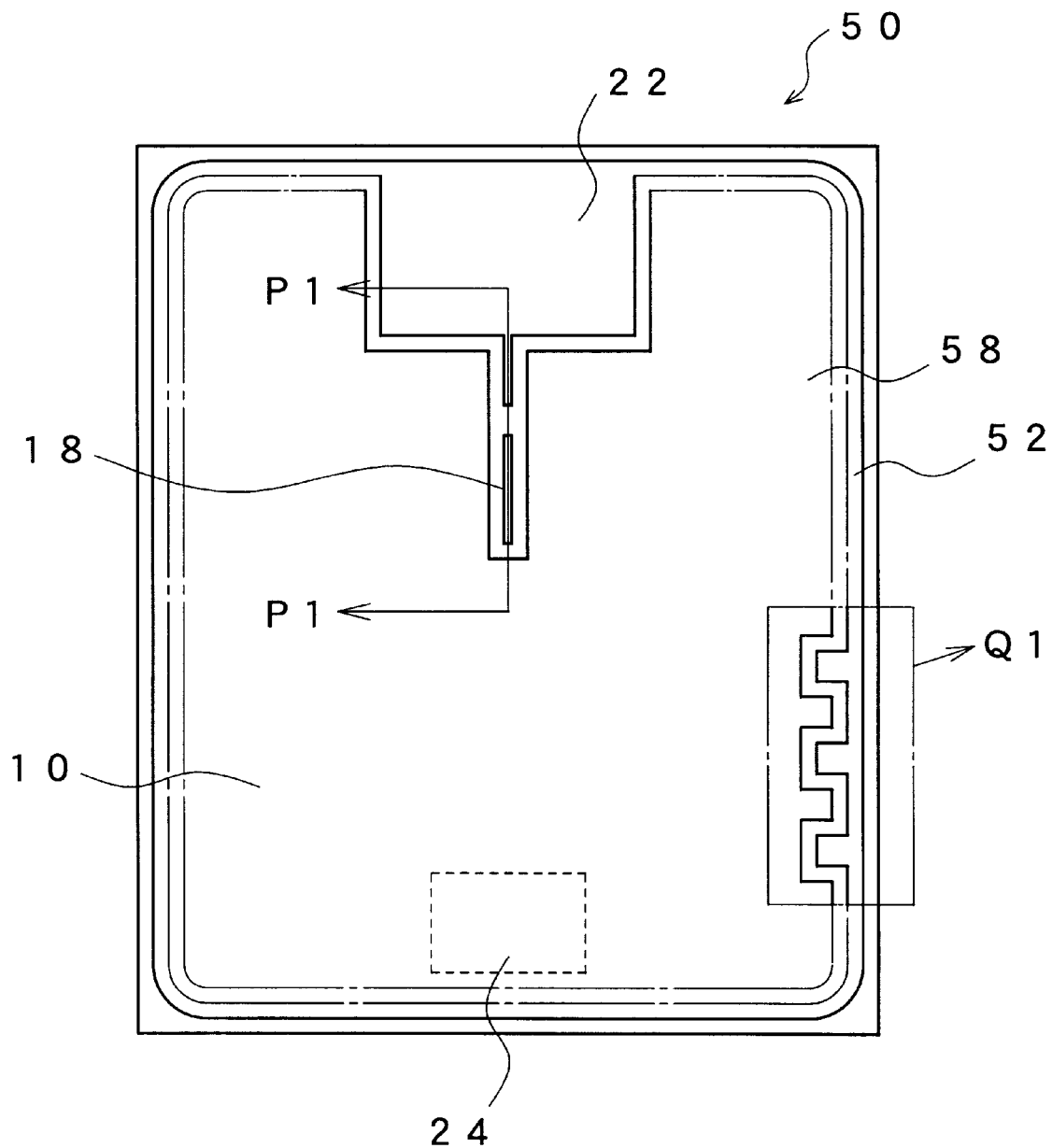
FIG. 2 is a plane view of the D-MOSFET in an embodiment of the present invention.
Figure 3A:
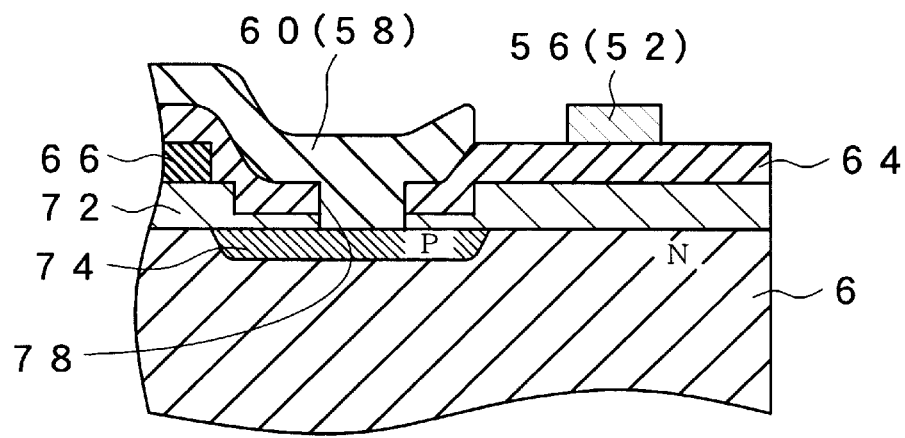
FIG. 3A is a sectional view, the view being taken on the plane Q2—Q2 of the D-MOSFET shown in FIG. 1.
Figure 3B:
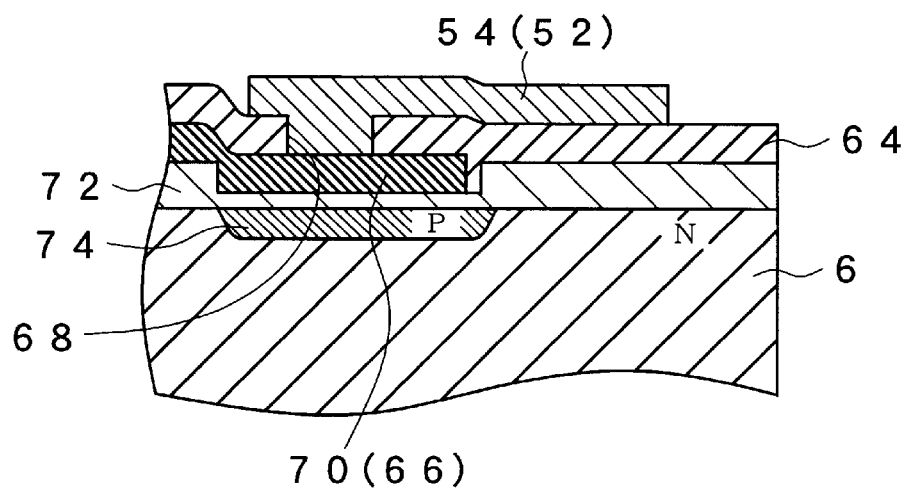
FIG. 3B is a sectional view, the view being taken on the plane Q3—Q3 of the D-MOSFET shown in FIG. 1.
Figure 13:
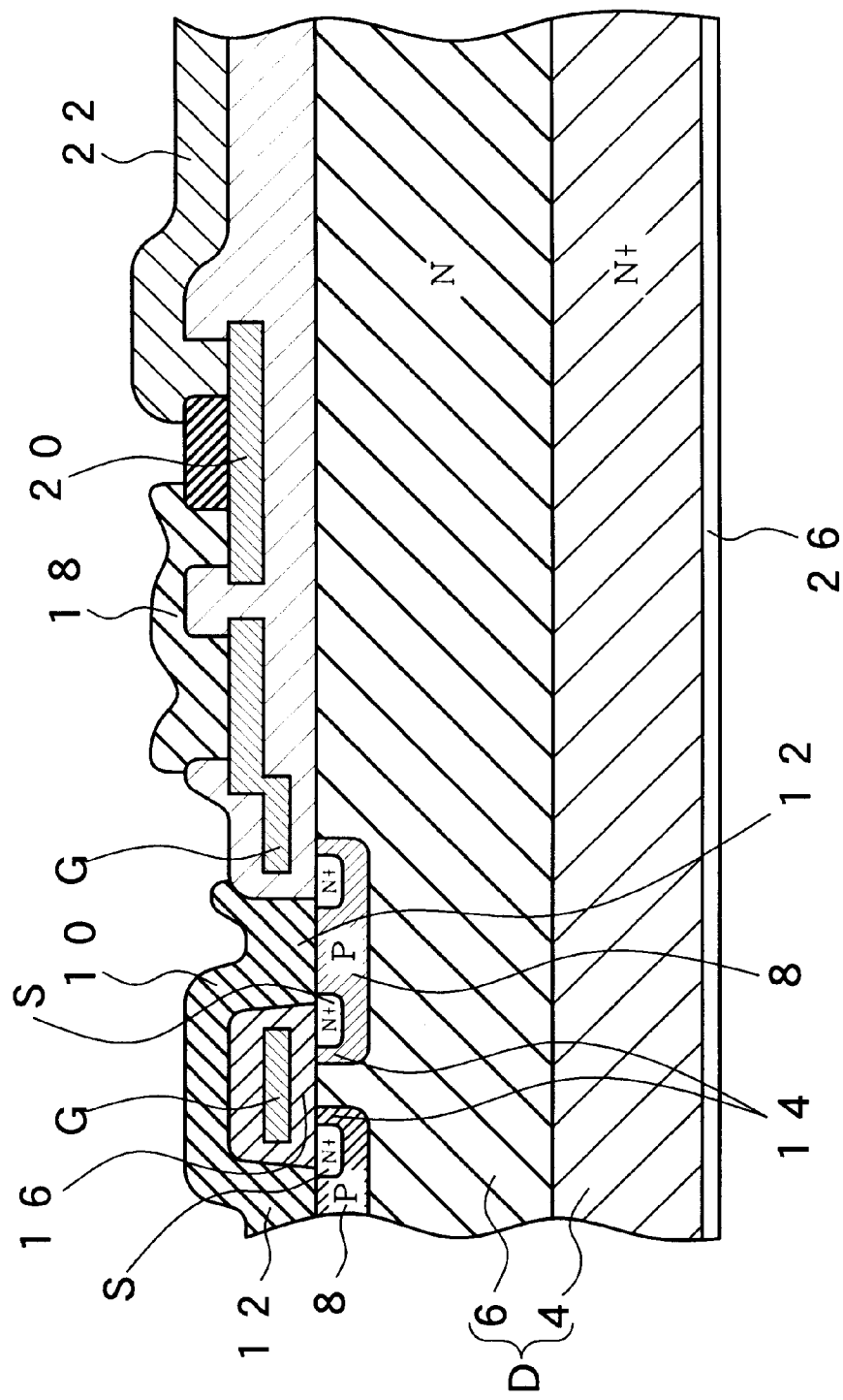
FIG. 13 is a sectional view, the view being taken on the plane P1—P1 of the D-MOSFET of the prior art.
Figure 14A:
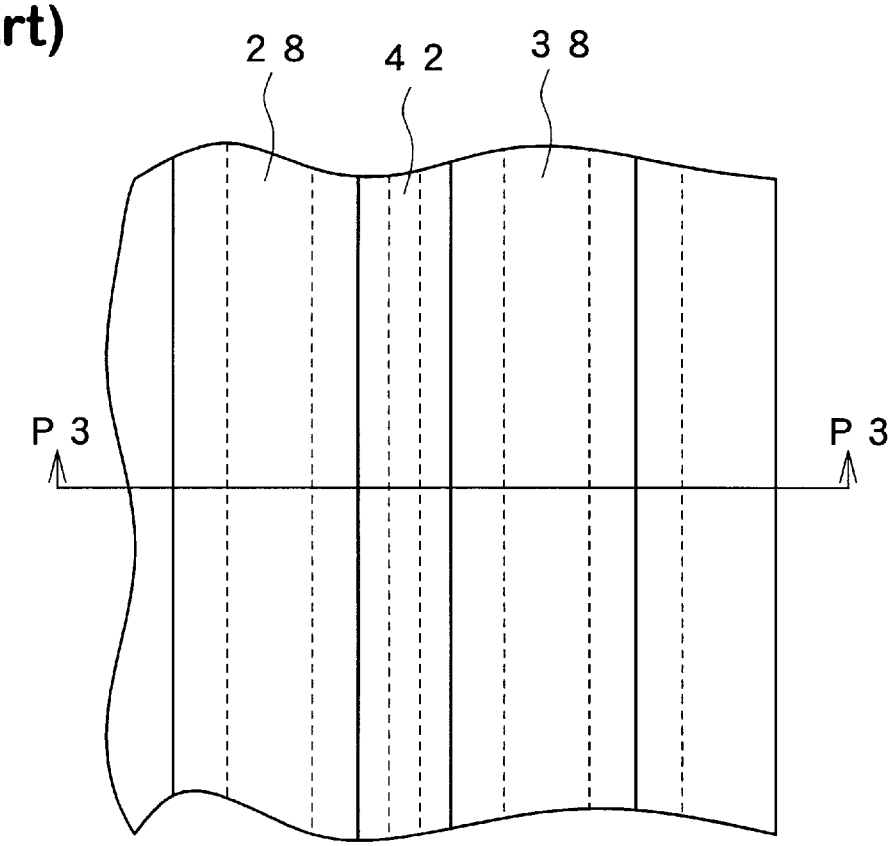
FIG. 14A is an enlarged plane view of perimeter of the D-MOSFET in the prior art.
Figure 14B:
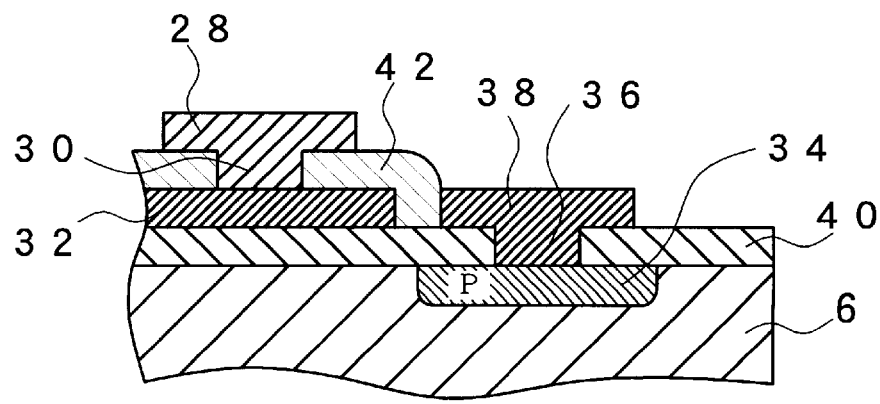
FIG. 14B is a sectional view, the view being taken on the plane P3—P3 of FIG. 14A.

FIG. 2 is a plane view illustrating a D-MOSFET 50 as a semiconductor device in an embodiment of the present invention. A construction of the D-MOSFET 50 a view of which being taken on the plane P1—P1 is identical with the construction shown in FIG. 13. FIG. 1 shows an enlarged plane view of perimeter of the D-MOSFET. FIG. 3A show a sectional view taken on the plane Q2—Q2 of FIG. 1, and FIG. 3B is a sectional view taken on the plane Q3—Q3 of FIG. 1 respectively.

As shown in FIG. 1, a perimeter gate wiring 52 act as a first wiring made of aluminum having lower electric resistance is provided with vicinity of perimeter surface of the D-MOSFET 2. A perimeter gate wiring 52 comprises a plurality of contact portion 54 and an interconnecting portion 56 having narrower width than the contact portion 54 which connects the contact portion 54 mutually.

A source wiring perimeter portion 58 made of aluminum to act as a second wiring is provided to an interior of a perimeter gate wiring 52 positioned on surface of the D-MOSFET under maintaining insulation from the perimeter gate wiring 52. The source wiring perimeter portion 58 is a part of a source wiring 10 and positioned outer end of the source wiring 10 (see FIG. 2). The source wiring perimeter portion 58 comprises a contact portion 60 and an interconnecting portion 62 having narrower width than the contact portion 60 which connects the contact portion 60 mutually.

The D-MOSFET 50 in the present invention, the contact portion 54 of the perimeter gate wiring 52 and the interconnecting portion 62 of the source wiring perimeter portion 58 are mutually provided adjacently. The interconnecting portion 56 of the perimeter gate wiring 52 and the contact portion 60 of the source wiring perimeter portion 58 are mutually provided adjacently. Also, the contact portion 54 of the perimeter gate wiring 52 and the contact portion 60 of the source wiring perimeter portion 58 are provided with one another become substantially in a straight line.

As shown in FIG. 3B, a gate perimeter portion 66 to act as first region to be connected is provided under the perimeter gate wiring 52 through an inter layer 64 which acts as a first insulation layer. The gate perimeter portion 66 is a portion of perimeter of gate G (see FIG. 13) made of polysilicon and is formed in a shape of the teeth of a comb (hereinafter referred to as comb teeth) (see FIG. 1).

The contact portion 54 of the perimeter gate wiring 52 is connected with a teeth portion 70 of the comb teeth thorough a perimeter gate contact hole 68 to act as a first contact hole which is made within the inter layer 64. In other words, the perimeter gate wiring 52 and the gate perimeter portion 66 are connected electrically with each other.

As shown in FIG. 3A, a perimeter diffusion layer 74 act as second region to be connected is positioned under the gate perimeter portion 66 through the silicon oxidation layer 72 act as the second insulation layer. The perimeter diffusion layer 74 is made as a diffusion layer of P conductive type and is formed within an epitaxial growth layer 6 in "belt-like" shape (see FIG. 1).

The contact portion 60 of the source wiring perimeter portion 58 is connected with the perimeter diffusion layer 74 through a perimeter source contact hole 78 act as a second contact hole which is made within the inter layer 64 exists in a portion between teeth 76 and within a silicon oxidation layer 72. In other words, the source wiring perimeter portion 58 and the perimeter diffusion layer 74 are connected with each other electrically.

By constructing the D-MOSFET as described in the above, it is possible to narrow a width of both the perimeter gate wiring 52 and the source wiring perimeter portion 58 with maintaining sufficient contact not only between the perimeter gate wiring 52 and the gate perimeter portion 66, but also between the source wiring perimeter portion 58 and the perimeter diffusion layer 74. In other words, a width need for wiring can be narrower at the perimeter gate wiring 52 and the source wiring perimeter portion 58 in comparison with when the contact portion 54 and the contact portion 60 are provided adjacently each other.

Figure 4A:
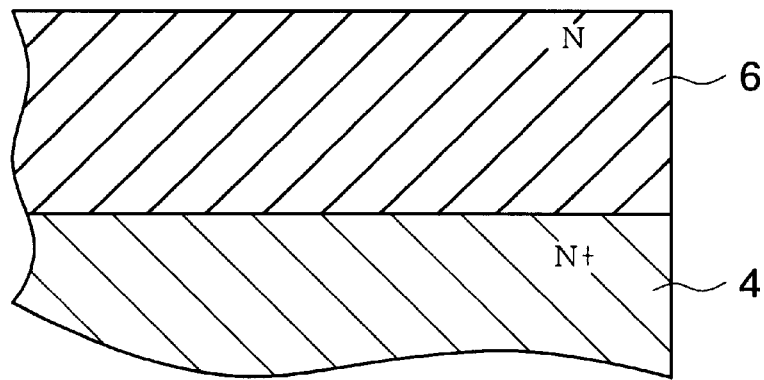
FIG. 4A is a sectional view, the view being taken on the plane Q2—Q2 of FIG. 1 in a production process.
Figure 4B:
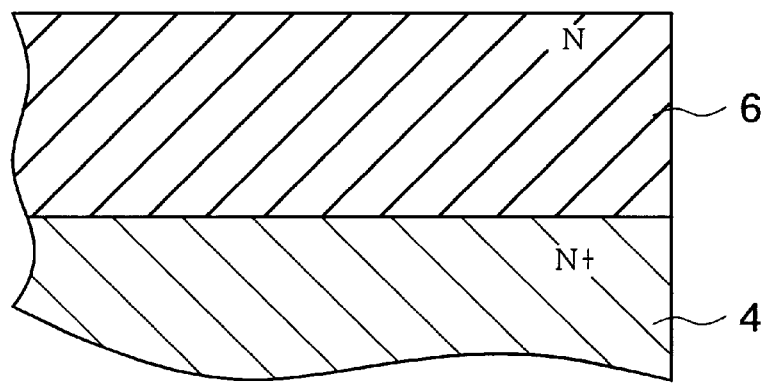
FIG. 4B is a sectional view, the view being taken on the plane Q3—Q3 of FIG. 1 in a production process.

Next, a method for manufacturing the D-MOSFET 50 is described with reference to FIG. 3A, FIG. 3B, FIG. 4A, FIG. 4B, FIG. 5A, FIG. 5B, FIG. 6A, FIG. 6B, FIG. 7A, FIG. 7B, FIG. 8A and FIG. 8B. FIG. 3A, FIG. 4A, FIG. 5A, FIG. 6A, FIG. 7A and FIG. 8A are the views being taken on the plane Q2—Q2 of FIG. 1. And FIG. 3B, FIG. 4B, FIG. 5B, FIG. 6B, FIG. 7B and FIG. 8B are the views being taken on the plane Q3—Q3 of FIG. 1. At first, the epitaxial growth layer 6 is formed on an N type conductive substrate 4 as shown in FIG. 4A and FIG. 4B.

Figure 5A:
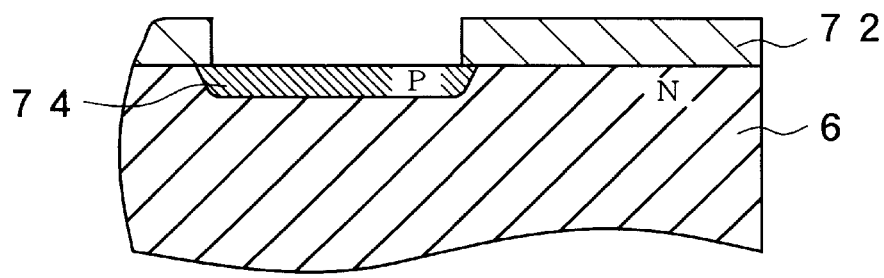
FIG. 5A is a sectional view, the view being taken on the plane Q2—Q2 of FIG. 1 in a production process.
Figure 5B:
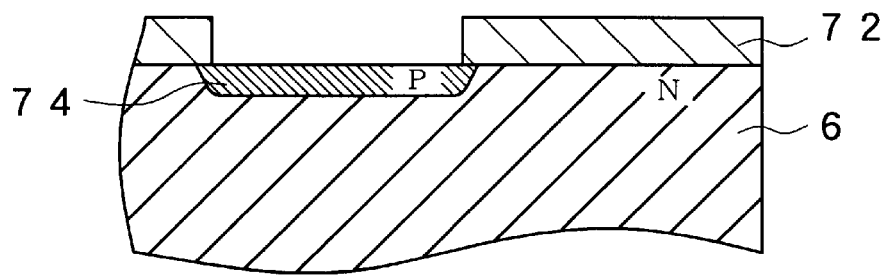
FIG. 5B is a sectional view, the view being taken on the plane Q3—Q3 of FIG. 1 in a production process.

Next, the silicon oxidation layer 72 is formed on the epitaxial growth layer 6 by thermal oxidation method as shown in FIG. 5A and FIG. 5B. The P conductive type perimeter diffusion layer 74 is formed in the epitaxial growth layer 6 by carrying out following steps, such as step for implanting boron as P type impurities into the epitaxial growth layer 6 after removing a part of the silicon oxidation layer 72 and step for diffusing the boron by thermal diffusion.

Figure 6A:
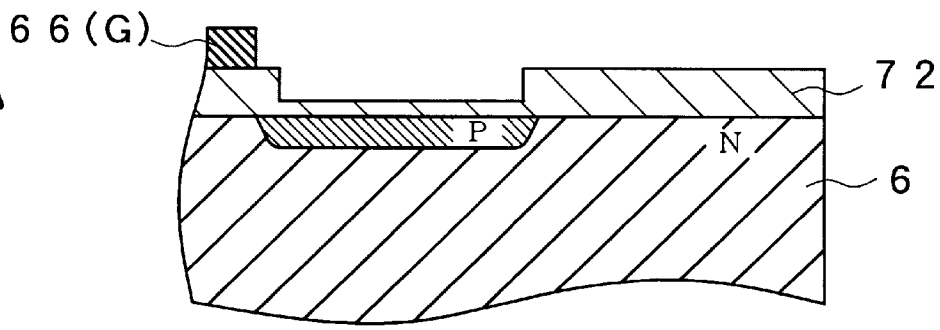
FIG. 6A is a sectional view, the view being taken on the plane Q2—Q2 of FIG. 1 in a production process.
Figure 6B:
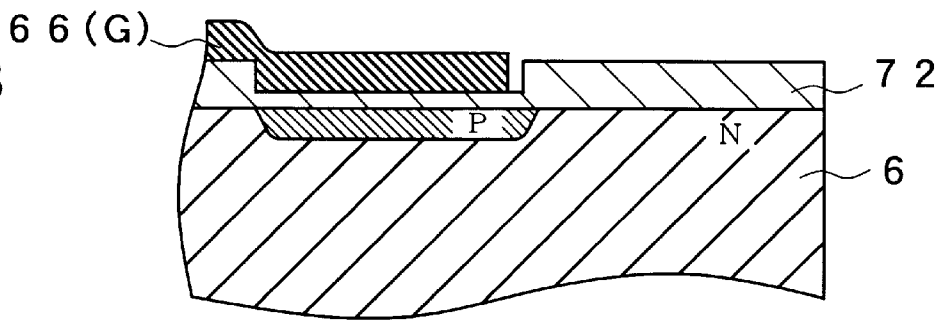
FIG. 6B is a sectional view, the view being taken on the plane Q3—Q3 of FIG. 1 in a production process.

Thereafter, the gate G (including the gate perimeter portion 66) is formed on the silicon oxidation layer 72 as shown in FIG. 6A, FIG. 6B. The gate G is formed by accumulating polysilicon onto the silicon oxidation layer 72 and then the polysilicon thus accumulated is patterned in a predetermined shape.

Figure 7A:
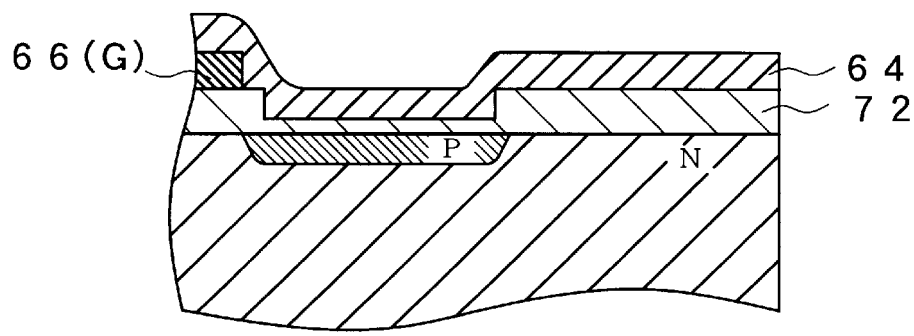
FIG. 7A is a sectional view, the view being taken on the plane Q2—Q2 of FIG. 1 in a production process.
Figure 7B:
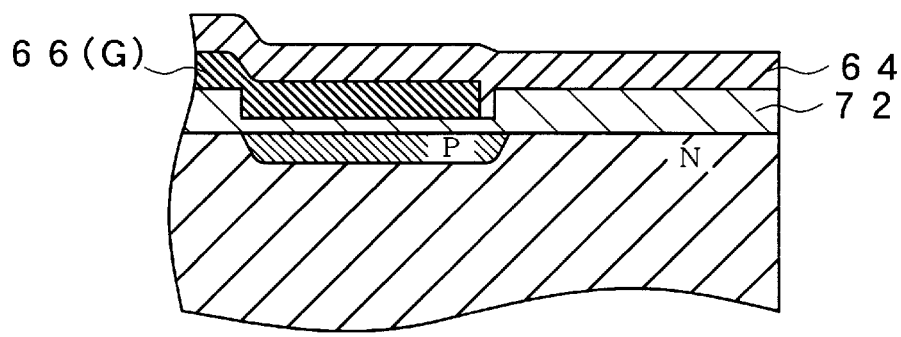
FIG. 7B is a sectional view, the view being taken on the plane Q3—Q3 of FIG. 1 in a production process.

After forming the gate G, the inter layer 64 is formed as shown in FIG. 7A and FIG. 7B. The inter layer 64 is formed by accumulating PSG (Phospho-Silicate Glass) or the like on the gate G and the silicon oxidation layer 72 using CVD (Chemical Vapor Deposition) method.

Figure 8A:
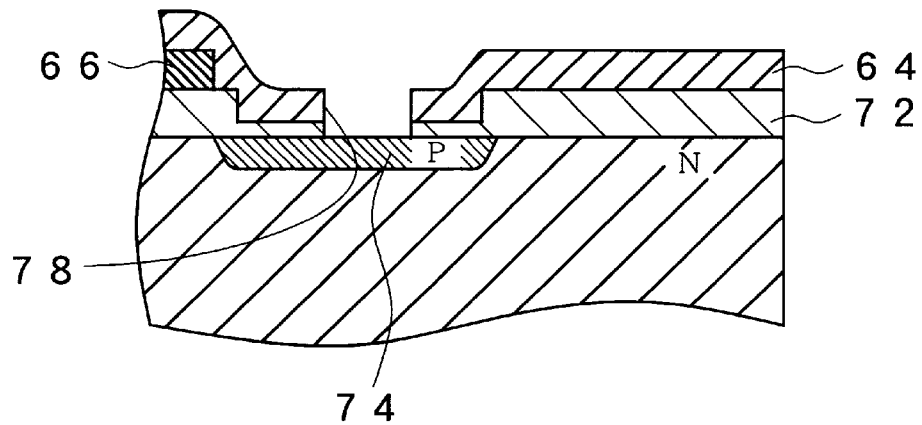
FIG. 8A is a sectional view, the view being taken on the plane Q2—Q2 of FIG. 1 in a production process.
Figure 8B:
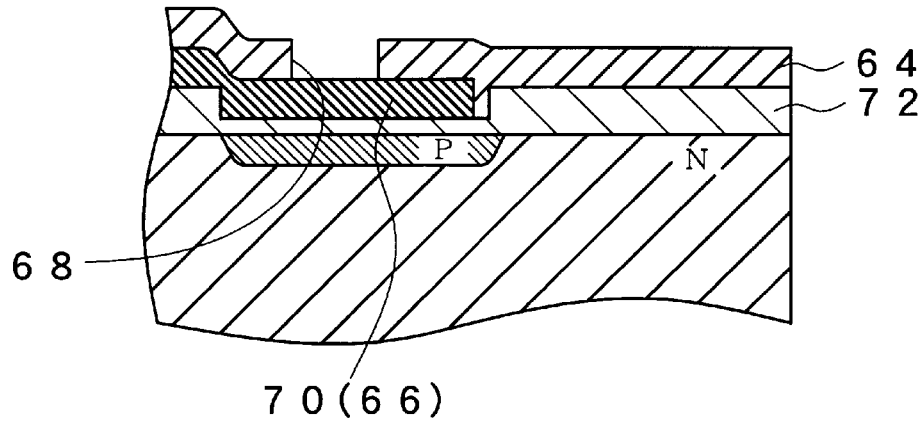
FIG. 8B is a sectional view, the view being taken on the plane Q3—Q3 of FIG. 1 in a production process.

On forming the inter layer 64, both the perimeter source contact hole 78 (see FIG. 8A) and the perimeter gate contact hole 68 (see FIG. 8B) are made as shown in FIG. 8A and FIG. 8B. The perimeter source contact hole 78 is made by digging a hole to the inter layer 64 and the silicon oxidation layer 72 so as to reach the hole to the perimeter diffusion layer 74 (see FIG. 8A). The perimeter gate contact hole 68 is made by digging a hole to the inter layer 64 so as to reach the hole to the teeth portion 70 of the comb teeth of the gate perimeter portion 66 (see FIG. 1).

Next, the source wiring 10 (including the source wiring perimeter portion 58), the perimeter gate wiring 52 and the gate electrode 18 etc. are formed as shown in FIG. 3A and FIG. 3B (see FIG. 2). The source wiring 10, the perimeter gate wiring 52 and the gate electrode 18 etc. are formed by following steps, such as an aluminum layer is formed on the inter layer 64 by spattering method and then the aluminum layer thus formed is patterned in predetermined shape. Thus, the D-MOSFET 50 completed.

Figure 9A:
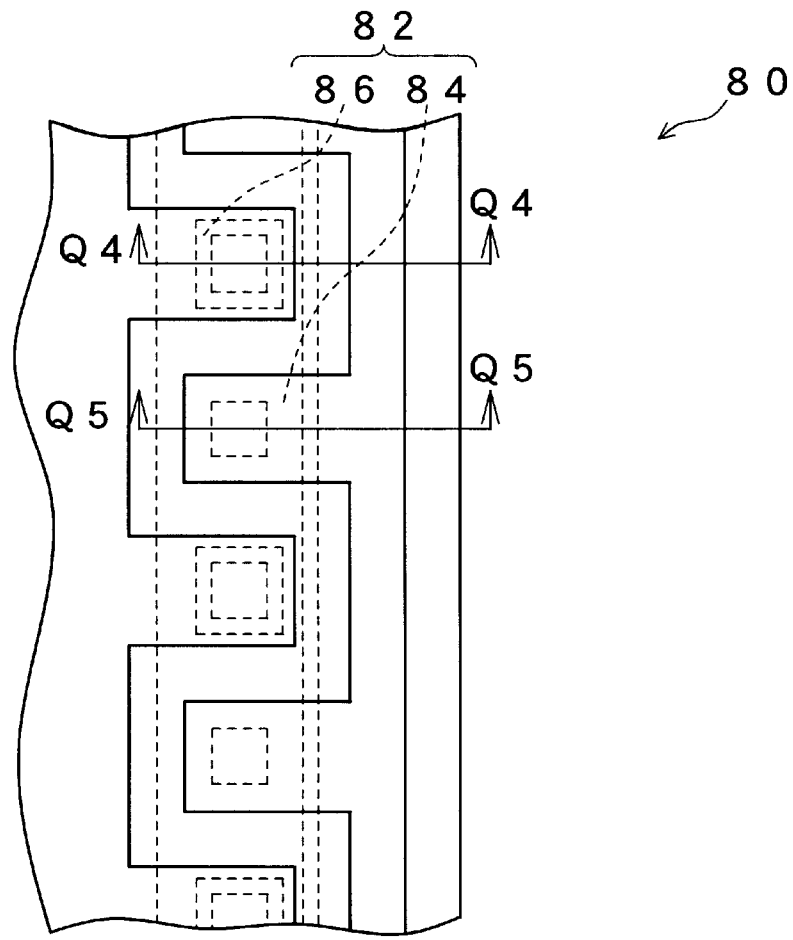
FIG. 9A is an enlarged plane view of perimeter of the D-MOSFET in another embodiment of the present invention.
Figure 9B:
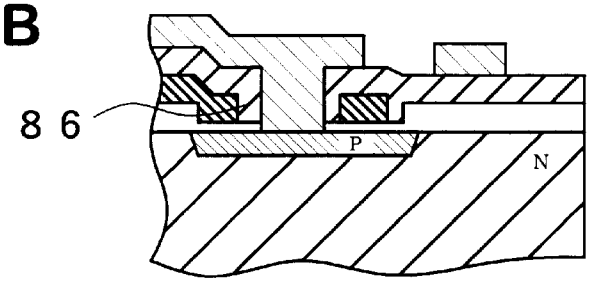
FIG. 9B is a sectional view, the view being taken on the plane Q4—Q4 of FIG. 9A.
Figure 9C:
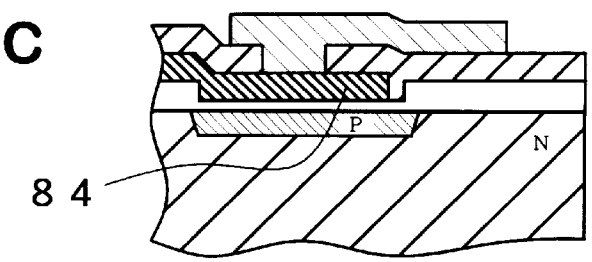
FIG. 9C is a sectional view, the view being taken on the plane Q5—Q5 of FIG. 9A.

Thereafter, constructions of vicinity of perimeter of a D-MOSFET 80 in another embodiment of the present invention are shown in FIG. 9A, FIG. 9B and FIG. 9C. The construction except for the vicinity of perimeter of the D-MOSFET 80 is identical to that of the D-MOSFET 50 described in the above. The gate perimeter portion 66 is composed so as to form the comb teeth shape by arranging the teeth portion 70 and the portion between teeth 76 alternately in the D-MOSFET 50 shown in FIG. 1.

The gate perimeter portion 82 in the D-MOSFET 80 is composed so as to form a ladder shape by using the portion between teeth of the comb teeth as closed spaces formed in rectangular shape as shown in FIG. 9A, FIG. 9B and FIG. 9C. In other words, the ladder shape thus composed is formed by a teeth portion 84 correspond to the horizontal bars of the ladder and a portion between teeth 86 correspond to the closed space formed between the horizontal bars alternatively. Thus, shape of the gate perimeter portion 82 can be formed not only in the comb teeth shape, but also formed in a shape having the comb teeth in part (for instance in the ladder shape).

Figure 10A:
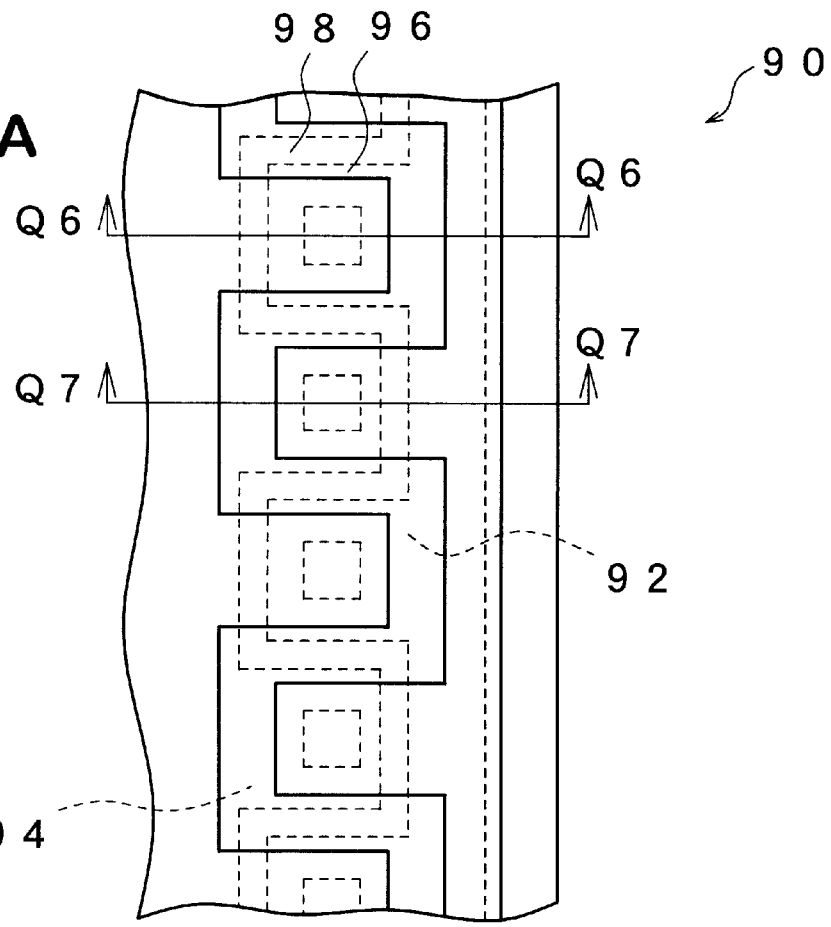
FIG. 10A is an enlarged plane view of perimeter of the D-MOSFET in still another embodiment of the present invention.
Figure 10B:
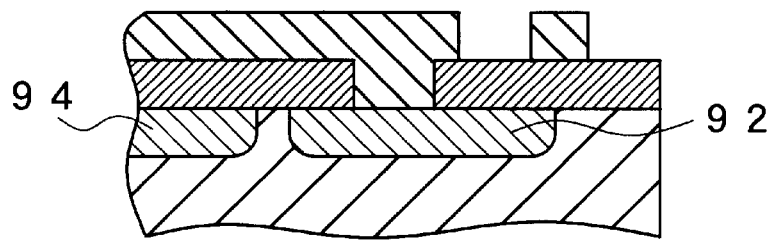
FIG. 10B is a sectional view, the view being taken on the plane Q6—Q6 of FIG. 10A.
Figure 10C:
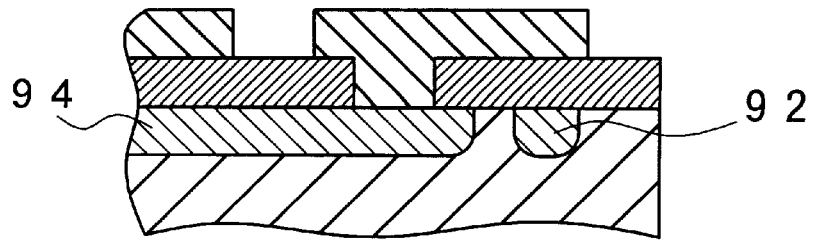
FIG. 10C is a sectional view, the view being taken on the plane Q7—Q7 of FIG. 10A.

Next, FIG. 10A, FIG. 10B and FIG. 10C show constructions of vicinity of perimeter of a D-MOSFET 90 in still another embodiment of the present invention. The perimeter diffusion layer 74 which act as the second region to be connected is positioned under the gate perimeter portion 66 or 82 through the silicon oxidation layer 72 act as the second insulation layer as shown in the D-MOSFET 50 in FIG. 1 and the D-MOSFET 80 shown in FIG. 9A, FIG. 9B and FIG. 9C. However, the second region to be connected 92 is positioned substantially on the same plane to the first region to be connected 94 formed in the comb teeth shape under maintaining insulation from the first region to be connected 94. Also, the second region to be connected 92 is formed in comb teeth shape and the teeth portion 96 of the second region to be connected is positioned in the portion between teeth 98 of the first region to be connected 94. Thus, it is possible to apply the present invention to the D-MOSFET 90 when both of the first region to be connected 94 and the second region to be connected 92 are positioned on the same plane.

Figure 11A:
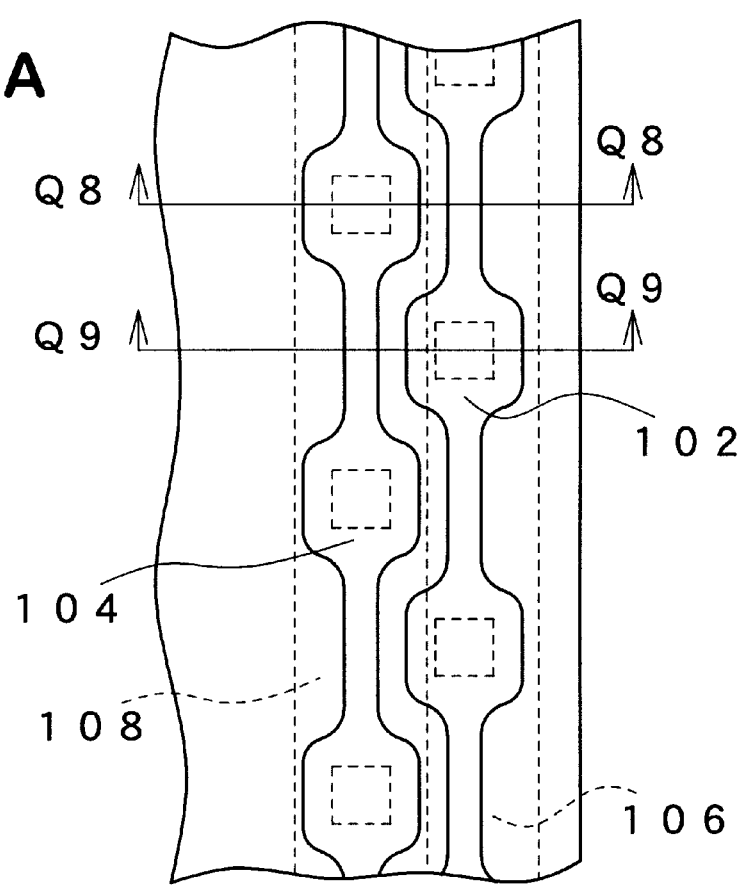
FIG. 11A is an enlarged plane view of perimeter of the D-MOSFET in far another embodiment of the present invention.
Figure 11B:
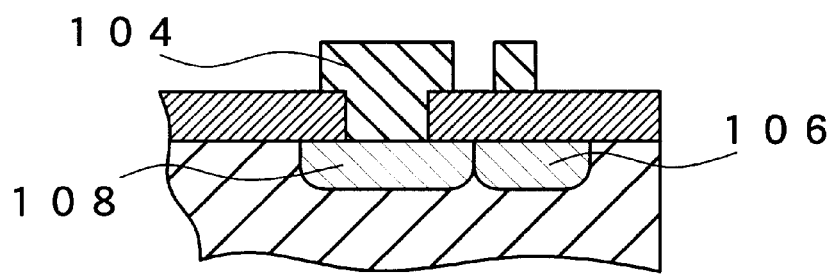
FIG. 11B is a sectional view, the view being taken on the plane Q8—Q8 of FIG. 11A.
Figure 11C:
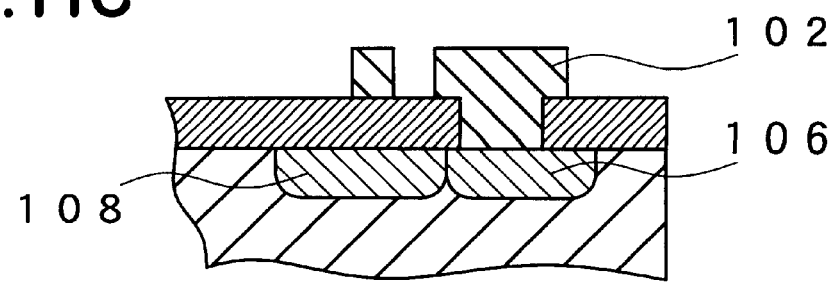
FIG. 11C is a sectional view, the view being taken on the plane Q9—Q9 of FIG. 11A.
Figure 12:
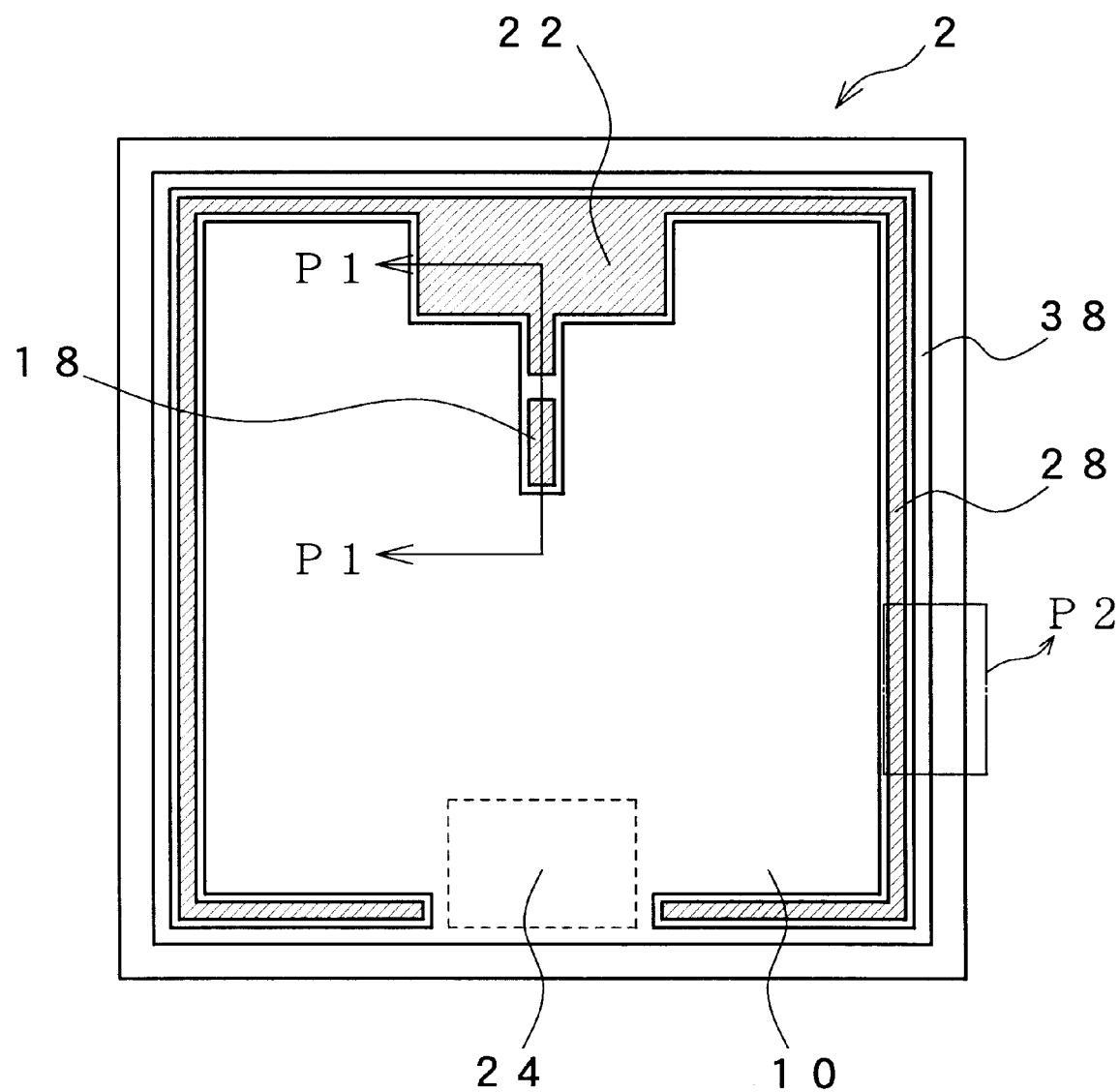
FIG. 12 is a plane view of the D-MOSFET in the prior art.

Thereafter, FIG. 11A, FIG. 11B and FIG. 11C show constructions of vicinity of perimeter of a D-MOSFET 100 in far another embodiment of the present invention. Although the contact portion 54 of the perimeter gate wiring 52 act as a contact portion of the first wiring and the contact portion 60 of the source wiring perimeter portion 58 act as a contact part of the second wiring are provided with one another become substantially in a straight line as in the D-MOSFET 50 shown in FIG. 1 as well as in the D-MOSFET 80 shown in FIG. 9A, FIG. 9B and FIG. 9C, and in the D-MOSFET 90 shown in FIG. 10A, FIG. 10B and FIG. 10C.

A contact portion 102 of the first wiring and a contact portion 104 of the second wiring are provided with one another substantially in zigzag shape. By providing both of the contact portion 102 and 104 as described in the above, it is possible to make the space for wiring in narrower width without forming a first region to be connected 106 and second region to be connected 108 in a complex construction such as two-layer structure or in comb teeth shape.

Details of the present invention is described when the present invention is applied to the D-MOSFETs having two wirings provided correspondently with two independent regions to be connected in the embodiments described in the above. However, it is possible to apply the present invention to a D-MOSFET having more than three wirings provided correspondently with three independent regions to be connected.

The semiconductor device and the method for wiring of a semiconductor in the present invention is characterized in that, each of the wirings comprises the contact portion and the interconnecting portion having narrower width than the contact portions which connect the contact portion mutually, and each of the wirings is formed so as to connect to the regions to be connected electrically at the contact portions, and the contact portions of one of the wirings are provided so as to position adjacently to the interconnecting portions of the wirings provided adjacently to one of the wirings.

Therefore, a width need for two wirings provided adjacently and insulation regions formed therebetween can be narrower in comparison with the width of two wirings when the contact portions of the wirings are provided adjacently with each other. That is, it is possible to provide a semiconductor device having smaller space for wiring.

Also, the semiconductor device and the method for wiring of a semiconductor in the present invention is characterized in that, the first region to be connected is formed in a shape having comb teeth, and the contact portions of the first wiring and the contact portions of the second wiring are provided with one another substantially in a straight line.

Therefore, a width need for wiring can be narrower in comparison with when both the first region to be connected and the second region to be connected are formed in a straight line, and the contact portion of the first wiring and the contact portion of the second wiring are provided in zigzag shape. That is, it is possible to provide a semiconductor device having smaller space for wiring.

Further, the semiconductor device and the method for wiring of a semiconductor in the present invention is characterized in that, the first region to be connected is formed in comb teeth shape, and the second region to be connected is positioned substantially on the same plane to the first region to be connected and is formed in comb teeth shape, and a teeth portion of the second region to be connected is positioned in a portion between teeth of the first region to be connected.

Therefore, a width need for both the first wiring and the second wiring can be narrower even when both the first region to be connected and the second region to be connected must be positioned substantially on the same plane. That is, it is possible to provide a semiconductor device having smaller space for wiring.

Still further, the semiconductor device and the method for wiring of a semiconductor in the present invention is characterized in that, the second region to be connected is provided under the first region to be connected through the insulation layer.

Therefore, a width need for both the first wiring and the second wiring can be narrower even when both the first region to be connected and the second region to be connected must be formed in two-layer structure. That is, it is possible to provide a semiconductor device having smaller space for wiring.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor device comprising:

plural regions to be connected, each of which is made of one of a semiconductive substance and a conductive substance, the regions being provided independently and formed as one sequential region, a first insulation layer formed on the regions to be connected, at least two wirings provided independently on the first insulation layer corresponding to the respective regions to be connected, characterized in that each of the regions to be connected is electrically connected to a corresponding one of the wirings through respective contact holes, and wherein each of the wirings comprises contact portions provided on the respective contact holes and interconnecting portions interposed between the respective contact portions to connect the respective contact portions together, the interconnecting portions having narrowerwidths than the contact portions, and wherein the contact portions of one of the wirings are positioned in confronting relation with the interconnecting portions of another of the wirings; and wherein a first region to be connected is formed in a shape having comb teeth, and wherein a first wiring is connected electrically to the first region to be connnected through a first contact hole provided so as to reach to a teeth portion of the comb teeth, and wherein a second wiring is connected electrically to a second region to be connected through a second contact hole provided so as to reach to a portion between the comb teeth, or through a second contact hole provided so as to penetrate the portion between the comb teeth, and wherein the contact portion of the first wiring and the contact portion of the second wiring are provided with one antother become substantially in a straight line.

2. A semiconductor device in accordance with claim 1, wherein the first region to be connected is formed in comb teeth shape, and wherein the second region to be connected is positioned substantially on the same plane to the first region to be connected and is formed in comb teeth shape under insulation from the first region to be connected, and wherein a teeth portion of the second region to be connected is positioned in a portion between teeth of the first region to be connected.

3. A semiconductor device in accordance with claim 1, wherein the second region to be connected is provided under the first region to be connected through a second insulation layer.

4. A semiconductor device in accordance with claim 3, wherein the semiconductor device is a D-MOSFET, and wherein the first region to be connected is a gate perimeter portion made of polysilicon, and wherein the first wiring is a perimeter gate wiring made of aluminum, and wherein occurrence of voltage drop is prevented by connecting the gate perimeter portion to the perimeter gate wiring electrically, and wherein the second region to be connected is a perimeter diffusion layer made of semiconductor substance, and wherein the second wiring is a source wiring perimeter portion made of aluminum, and wherein predetermined voltage is maintained among source regions studded over a wide range by connecting the perimeter diffusion layer and the source wiring perimeter portion electrically.

5. A semiconductor device comprising:
    regions to be connected each of which being made of semiconducting substance or conductive substance, being provided independently;
    a first insulation layer formed on the regions to be connected; and
    wirings provided independently on the first insulation layer correspond to each of the regions to be connected, and being connected with each of the regions to be connected through contact holes provided in the first insulation layer;
    wherein each of the wirings is formed so as to have contact portions provided on the contact holes and interconnecting portions having narrower width than the contact portions which connect the contact portions mutually, and the contact portions of one of the wirings are provided so as to position adjacently to the interconnecting portions of the wirings provided adjacently to one of the wirings; and
    wherein a first region to be connected is formed in a shape having comb teeth, and wherein a first wiring is connected electrically to the first region to be connected through a first contact hole provided so as to reach to a teeth portion of the comb teeth, and wherein a second wiring is connected electrically to a second region to be connected through a second contact hole provided so as to reach to a portion between the comb teeth, or through a second contact hole provided so as to penetrate the portion between the comb teeth, and wherein the contact portion of the first wiring and the contact portion of the second wiring are provided with one another become substantially in a straight line.

6. The semiconductor device in accordance with claim 5, wherein the first region to be connected is formed in comb teeth shape, and wherein the second region to be connected is positioned substantially on the same plane to the first region to be connected and is formed in comb teeth shape under insulation from the first region to be connected, and wherein a teeth portion of the second region to be connected is positioned in a portion between teeth of the first region to be connected.

7. The semiconductor device in accordance with claim 5, wherein the second region to be connected is provided under the first region to be connected through a second insulation layer.

8. The semiconductor device in accordance with claim 7, wherein the semiconductor device is a D-MOSFET, and wherein the first region to be connected is a gate perimeter portion made of polysilicon, and wherein the first wiring is a perimeter gate wiring made of aluminum, and wherein occurrence of voltage drop is prevented by connecting the gate perimeter portion to the perimeter gate wiring electrically, and wherein the second region to be connected is a perimeter diffusion layer made of semiconductor substance, and wherein the second wiring is a source wiring perimeter portion made of aluminum, and wherein predetermined voltage is maintained among source regions studded over a wide range by connecting the perimeter diffusion layer and the source wiring perimeter portion electrically.

9. A semiconductor device comprising:
    regions composed of one of a semiconducting substance or conductive substance;
    a first insulation layer formed on the regions and having a plurality of contact holes; and
    wirings disposed on the first insulation layer, with each wiring having:
    a contact portion; and
    an interconnecting portion;
    wherein each wiring corresponds to a respective region and is connected thereto at the respective contact portion and through a respective contact hole;
    wherein each interconnecting portions has a narrower width than the contact portions which connects the contact portions mutually;
    wherein the contact portions of one of the wirings are positioned adjacent to the interconnecting portions of the wirings adjacent to one of the wirings;
    wherein a first region to be connected is formed in a shape having comb teeth;
    wherein a first wiring is connected electrically to the first region to be connected through a first contact hole provided so as to extend to a teeth portion of the comb teeth;
    wherein a second wiring is connected electrically to a second region to be connected through a second contact hole extending to or penetrating through a portion between the comb teeth; and
    wherein the contact portion of the first wiring and the contact portion of the second wiring are oriented substantially in a straight line.

10. The semiconductor device in accordance with claim 9, wherein the first region to be connected is formed in comb teeth shape;
    wherein the second region to be connected is positioned substantially on the same plane to the first region to be connected and is formed in comb teeth shape under insulation from the first region to be connected; and
    wherein a teeth portion of the second region to be connected is positioned in a portion between teeth of the first region to be connected.

11. The semiconductor device in accordance with claim 9, wherein the second region to be connected is provided under the first region to be connected through a second insulation layer.

12. The semiconductor device in accordance with claim 11, wherein the semiconductor device is a D-MOSFET;

wherein the first region to be connected is a gate perimeter portion made of polysilicon;

wherein the first wiring is a perimeter gate wiring made of aluminum;

wherein occurrence of voltage drop is prevented by connecting the gate perimeter portion to the perimeter gate wiring electrically;

wherein the second region to be connected is a perimeter diffusion layer made of semiconductor substance;

wherein the second wiring is a source wiring perimeter portion made of aluminum; and wherein predetermined voltage is maintained among source regions studded over a wide range by connecting the perimeter diffusion layer and the source wiring perimeter portion electrically.

* * * * *